(12) United States Patent
Kim et al.

(10) Patent No.: US 10,944,402 B1
(45) Date of Patent: Mar. 9, 2021

(54) RECONFIGURABLE INTERCONNECT STRUCTURE IN INTEGRATED CIRCUITS

(71) Applicant: Intel Corporation, Santa Clara, CA (US)

(72) Inventors: SeongJong Kim, Trabuco Canyon, CA (US); Mark A. Anders, Hillsboro, OR (US); Himanshu Kaul, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/791,559

(22) Filed: Feb. 14, 2020

(51) Int. Cl.
*H03K 19/17756* (2020.01)
*H01L 23/522* (2006.01)

(52) U.S. Cl.
CPC ..... *H03K 19/17756* (2013.01); *H01L 23/522* (2013.01)

(58) Field of Classification Search
CPC .......... H03K 19/17756; H01L 23/522
See application file for complete search history.

(56) References Cited

U.S. PATENT DOCUMENTS

| 6,356,112 B1 * | 3/2002 | Tran ..................... H03K 19/215 |
| | | 326/113 |
| 2005/0218952 A1 * | 10/2005 | Padhye .................. G11C 5/147 |
| | | 327/218 |

* cited by examiner

*Primary Examiner* — Seokjin Kim
(74) *Attorney, Agent, or Firm* — Schwegman Lundberg & Woessner, P.A.

(57) ABSTRACT

Some embodiments include apparatuses having a first circuit path including drive units coupled in series between a first node and a first additional node, a second circuit path including drive units coupled in series between a second node and a second additional node, each drive unit of the driver units of the first circuit path and the second circuit path including an inverter, and a transmission gate circuit including an input node and an output node coupled to an input node and an output node, respectively, of the inverter; and control circuitry to provide control information to the transmission gate circuit of each of the driver units of the first circuit path and the second circuit path.

21 Claims, 10 Drawing Sheets

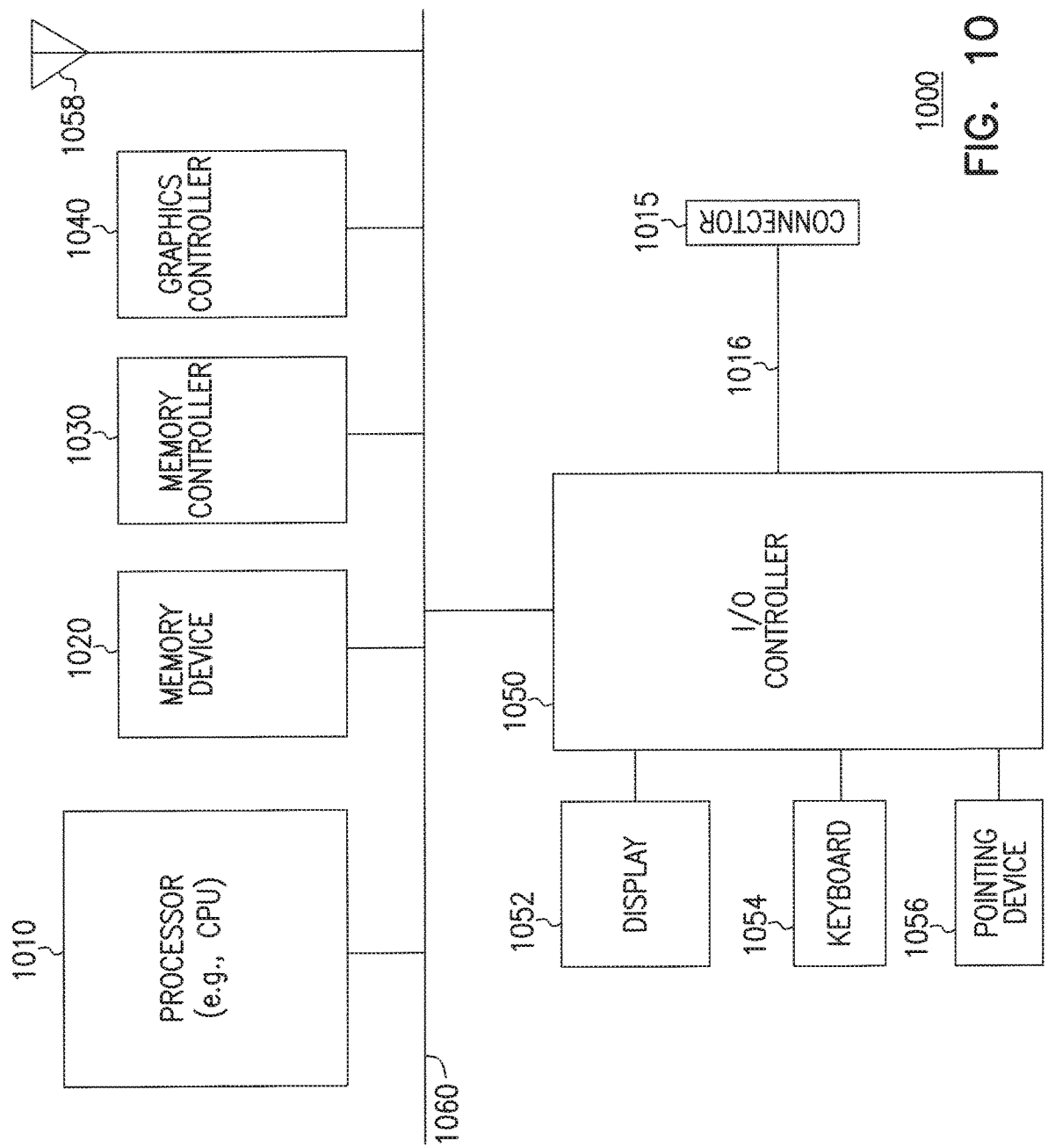

US 10,944,402 B1

RECONFIGURABLE INTERCONNECT STRUCTURE IN INTEGRATED CIRCUITS

FIELD

Embodiments of described herein relate to circuit paths in integrated circuits.

BACKGROUND

Integrated circuit devices such as processors reside in many computers and electronic systems. These devices often have internal interconnects (e.g., internal buses) to transmit signals between different components within the device. Clock frequency of high-performance processors in a certain operation mode (e.g., a high-voltage turbo/burst operation mode) can be governed primarily, by RC-dominated global interconnects in the device since the interconnect RC delay usually may not improve proportionally with logic gate delay at higher voltages. Some conventional current-mode and pre-emphasis techniques for improved interconnect throughput and energy efficiency put less emphasis on the critical turbo/burst mode latency requirements and may not consider tenability across a wide voltage-frequency operating range in high-performance processors. Their transmit and receive circuits with complicated data recovery and differential signaling incur major latency and wiring resource overheads, especially for shorter bus distances typical in the device. Other conventional current/voltage mode signaling used expensive repeaters in the interconnects and required multi-cycle windows for current-mode operation with limited power savings at high data activities. Some other conventional techniques address scalability to lower supply voltages. However, they may not focus on the critical interconnect RC delay bottlenecks at high voltages.

BRIEF DESCRIPTION OF THE DRAWINGS

FIG. 10 shows an apparatus in the form of a system (e.g., electronic system), according to some embodiments described herein.

DETAILED DESCRIPTION

The techniques described herein relate on-die interconnect structures (e.g., global on-die busses) in devices (e.g., processors). The described interconnect structure includes circuit paths and current/voltage-mode drive units (driver/repeater/receiver circuits) having a transient current-mode operation. The interconnect structure can be reconfigurable to operate in a voltage-mode operation at one time and a current-mode operation at another the time. Each of the drive units includes an inverter and a transmission gate circuit coupled to the input and output nodes of the inverter. The described current-mode operation can be enabled by turning on the transmission gate circuit, creating a feedback connection for the inverter. This feedback uses the inverter as part of a resistive termination, resulting in low overhead to implement reconfigurable voltage/current-mode operation. Low input swing in current-mode operation can be centered around each inverter's switching threshold. As a signal transition starts at the output of a current-mode repeater, the resistive termination at the following repeater momentarily drives the wire in the same direction. This early assist at the far end of the wire, along with reduced voltage swing, results in improved switching delay. Adding reconfiguration incurs a relatively small measured delay overhead in voltage-mode operation, and the current-mode operation enables interconnect delay to closely follow the more aggressive logic delay scaling at high voltages in turbo/burst mode. The techniques described herein also include a shared pulsed control scheme to enable fine grained current/voltage mode control to operate in current mode at the signal wave front, enabling performance similar to current mode with the power profile of voltage mode operation. Improvements and benefits of the techniques described herein include a lower delay relative to voltage-mode operation, a lower transient current-mode power comparing to an always-on current-mode operation at full data activity, similar noise immunity as voltage-mode operation, tunable current-mode configuration for optimized performance versus energy across PVT (process, voltage, and temperature) corners, and improved (e.g., increased) distance between repeater circuits in the interconnect structure. Other improvements and benefits are discussed below with reference to FIG. 1 through FIG. 10.

Figure 1:
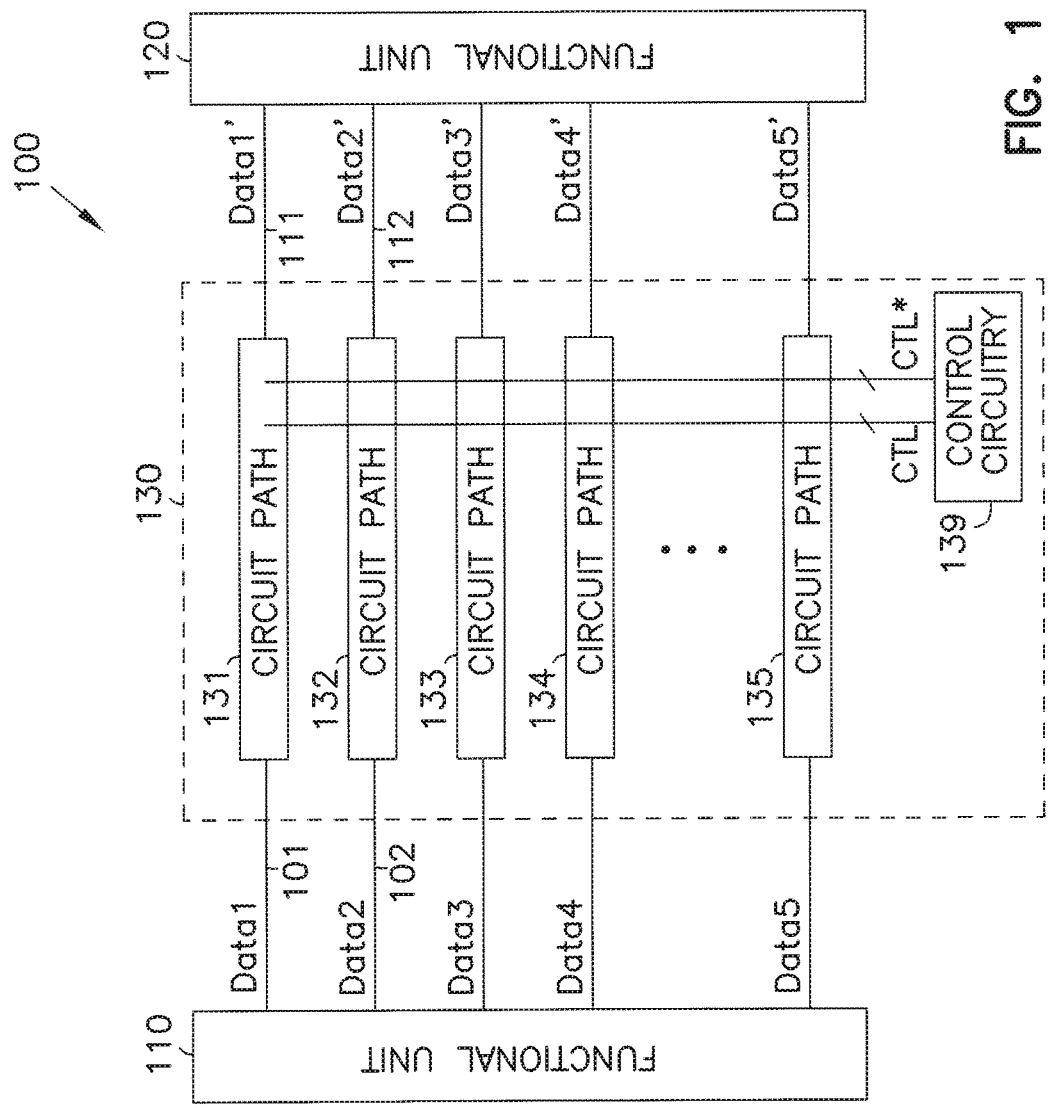
FIG. 1 shows an apparatus in the form of a device having an interconnect structure, according to some embodiments described herein.

FIG. 1 shows an apparatus in the form of a device 100 having an interconnect structure 130, according to some embodiments described herein. Device 100 can include functional units 110 and 120 coupled to interconnect structure 130. Each of the functional units 110 and 120 can include a number of circuit elements. For example, functional unit 110 can include transmitters or drivers, and functional unit 120 can include receivers. Interconnect structure 130 can include a bus (e.g., an on-die (or on-chip) bus) to transmit information (e.g., data) between functional units 110 and 120. Interconnect structure 130 can be included (e.g., fabricated on) the same integrated circuit (IC) chip (e.g., the same semiconductor die with functional units 110 and 120).

Device 100 can be a processing unit of any type of architecture, for example, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), hybrid architecture, and other architectures. Device 100 can also be a memory device, a memory controller, a graphic and memory controller, or other types of integrated circuits.

As shown in FIG. 1, interconnect structure 130 can include a number of circuit paths 131-135 (131, 132, 133, 134, and 135). Each of circuit paths 131-135 can connect to functional units 110 and 120 at different nodes. For example, circuit path 131 can connect to functional units 110 and 120 at nodes 101 and 111, respectively. In another example, circuit path 132 can connect to functional units 110 and 120 at nodes 102 and 112, respectively. FIG. 1 shows an example where interconnect structure 130 includes of five circuit paths. However, interconnect structure 130 includes a different number of circuit paths.

The combination of circuit path 131-135 can form a bus (e.g., an on-die bus) within device 100. Each of circuit paths 131-135 can include a number of circuit elements (e.g., driver/repeater/receiver circuits) to transmit data between functional units 110 and 120. The structures of circuit paths 131-135 can be same among each other. For example, circuit paths 131-135 can have the same type and number of driver/repeater/receiver circuits from one circuit path to another circuit path.

As shown in FIG. 1, functional unit 110 can transmit information (e.g., data in the form of signals) Data1, Data2, Data3, Data4, and Data5 from functional unit 110 to functional unit 120 on respective circuit paths 131-135. Information Data1', Data2', Data3', Data4', and Data5' received at functional unit 120 are information Data1, Data2, Data3, Data4, and Data5, respectively, transmitted by functional unit 110. Each of Data1, Data2, Data3, Data4, and Data5 can include a number of bits that can be represented by a signal on a respective circuit path among circuit paths 131-135.

As shown in FIG. 1, device 100 can include control circuitry 139 to generate (e.g., provide) information (e.g., control information or control signals) CTL and CTL* to circuit paths 131-135. Information CTL and CTL* can be in the form of analog information or digital information. For simplicity, FIG. 1 shows a single line (e.g., single conductive line) to carry information CTL. However, information CTL, can be provided on multiple conductive lines. Similarly, FIG. 1 shows a single line (e.g., single conductive line) to carry information CTL*. However, information CTL* can be provided on multiple conductive lines. As described in more detail below with reference to FIG. 2 and FIG. 3, each of circuit paths 131-135 can include drive units (not shown in FIG. 1) and each of the drive units can include an inverter and a transmission gate circuit coupled to the inverter. Control circuitry 139 can use information CTL and CTL to control (e.g., selectively turn on and turn off) the transmission gate circuits of the drive units in circuit paths 131-135 during operations of device 100. The operations can include transmitting information (e.g., Data1, Data2, Data3, Data4, and Data5) from functional unit 110 to functional unit 120.

Figure 2:
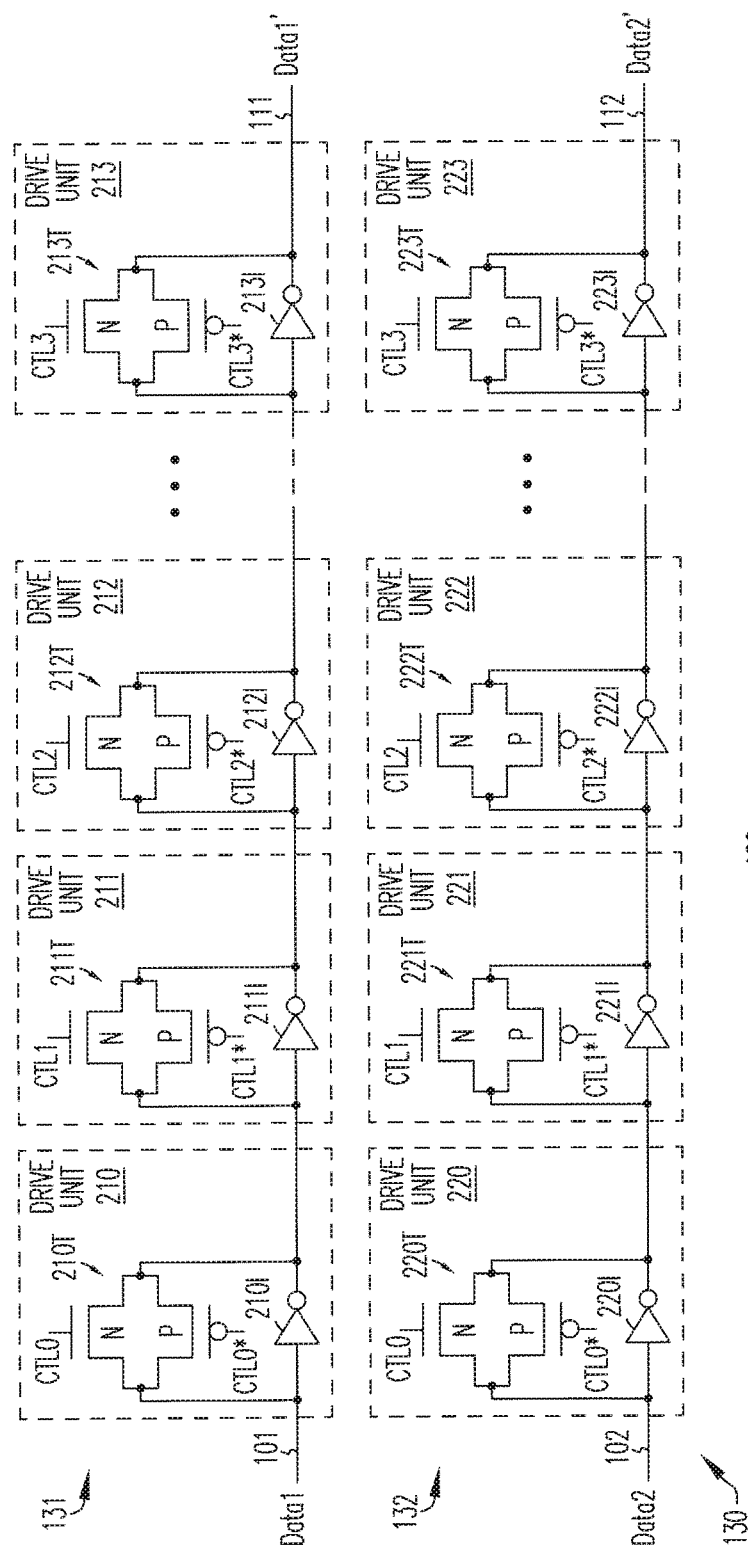
FIG. 2 shows details of some of circuit paths of the interconnect structure of FIG. 1, according to some embodiments described herein.

FIG. 2 shows details of circuit paths 131 and 132 of interconnect structure 130 of device 100, according to some embodiments described herein. For simplicity, only details of circuit paths 131 and 132 are shown in FIG. 2. Other circuit paths (e.g., circuit paths 133, 134, and 135) of interconnect structure 130 can have the circuit elements similar to or the same as that of circuit paths 131 and 132 shown in FIG. 2.

As shown in FIG. 2, circuit paths 131 and 132 can have the same structure and the number of circuit elements. For example, circuit path 131 can include drive units (e.g., repeater circuits) 210, 211, 212, and 213 coupled in series between nodes 101 and 111. Circuit path 132 can include drive units (e.g., repeater circuits) 220, 221, 222, and 223 coupled in series between nodes 102 and 112. The number of drive units are the same among the circuit paths (e.g., circuit paths 131 and 132) of interconnect structure 130. FIG. 2 shows example of four drive units in each circuit paths 131 and 132. However, the number of drive units in circuit paths 131 and 132 can be different from four.

As shown in FIG. 2, each of drive units 210, 211, 212, and 213 which can include an inverter (e.g., inverter 210I, 211I, 212I, or 213I and a transmission gate circuit (e.g., transmission gate circuit 210T, 211T, 212T, or 213T) coupled to the inverter. Similarly, each of drive unit 220, 221, 222, and 223 can include an inverter (e.g., inverter 220I, 221I, 222I, or 223I and a transmission gate circuit (e.g., transmission gate circuit 220T, 221T, 222T, or 223T) coupled to the inverter.

As shown in FIG. 2, each of transmission gate circuits can include a transistor N and a transistor P. Transistor N can include an n-channel metal-oxide semiconductor (NMOS) transistor. Transistor P can include a p-channel metal-oxide semiconductor (PMOS) transistor. Transistors N and P of a particular drive unit (e.g., drive unit 210) can form a transmission gate having input and output nodes (not labeled) coupled to the input and output nodes (not labeled), respectively, of the inverter (e.g., inverter 210I) of that particular drive unit. For example, as shown in FIG. 2, the drain terminals (not labeled) of transistors N and P of drive unit 210 can be coupled to each other and coupled to (e.g., directly coupled to) the input node (not labeled) of inverter 210I. The source terminals (not labeled) of transistors N and P of drive unit 210 can be coupled to each other and coupled to (e.g., directly coupled to) the output node (not labeled) of inverter 210I. The drain terminal and the source terminal can be used interchangeably.

FIG. 2 shows information (e.g., control information or control signals) CTL0, CTL1, CTL2, and CTL3 provided to respective gate terminals of transistors N of drive units 210, 211, 212, and 213 and respective gate terminals of transistors N of drive units 220, 221, 222, and 223. FIG. 2 also shows information (e.g., control information or control signals) CTL0*, CTL1*, CTL2*, and CTL3* provided to respective gate terminals of transistors P of drive units 210, 211, 212, and 213 and respective gate terminals of transistors P of drive units 220, 221, 222, and 223. Information CTL0, CTL1, CTL2, and CTL3 can be part of information CTL generated by control circuitry 139 (FIG. 1) of device 100. Information CTL0*, CTL1*, CTL2*, and CTL3* can be part of information CTL* generated by control circuitry 139 of device 100.

Information provided to a particular transmission gate circuit can include information having complementary values. For example, information CTL0 and CTL0* can have complementary values (e.g., complementary signals), information CTL1 and CTL1* can have complementary values (e.g., complementary signals), information CTL2 and CTL2* can have complementary values (e.g., complementary signals), and information CTL3 and CTL3* can have complementary values (e.g., complementary signals).

During an operation of device 100 information Data1 and Data2 can be concurrently transmitted on respective circuit paths 131 and 132. For example, during an operation of device 100 to transmit information Data1 from node 101 to node 111 (as information Data1'), device 100 can control the values of information CTL0, CTL1, CTL2, and CTL3 and CTL0*, CTL1*, CTL2*, and CTL3*, such that information Data1 (e.g., the bits represented by Data1) can be propagated from node 101 through drive units 210, 211, 212, and 213 to node 111 as information Data1' (which is the same as information Data1). In this the same example, information Data2 (e.g., the bits represented by Data2) can be propagated from node 102 through drive units 220, 221, 222, and 223 to node 112 as information Data2' (which is the same as information Data2).

Device 100 can operate in a voltage-mode operation at one time and a current-mode operation at another time. In a voltage-mode operation, device 100 can disable (e.g., deactivate or turn off) transmission gate circuits 210T, 211T, 212T, 213T, 220T, 221T, 222T, and 223T. For example, device 100 can provide information CTL0, CTL1, CTL2, and CTL with a voltage level (e.g., corresponding to logic 0) to turn off transistors N of transmission gate circuits 210T, 211T, 212T, 213T, 220T, 221T, 222T, and 223T, and provide information CTL0*, CTL1*, CTL2*, and CTL3* with a voltage level (e.g., corresponding to logic 1) to turn off transistors P of transmission gate circuits 210T, 211T, 212T, 213T, 220T, 221T, 222T, and 223T. In a voltage-mode operation, the inverters in circuit paths 131 and 132 can operate as normal inverters.

In a current-mode operation, device 100 can enable (e.g., activate or turn on) transmission gate circuits 210T, 211T, 212T, 213T, 220T, 221T, 222T, and 223T. For example, device 100 can provide information CTL0, CTL1, CTL2, and CTL with a voltage level (e.g., corresponding to logic 1) to turn on transistors N of transmission gate circuits 210T, 211T, 212T, 213T, 220T, 221T, 222T, and 223T, and provide information CTL0*, CTL1*, CTL2*, and CTL3* with a voltage level (e.g., corresponding to logic 0) to turn on transistors P of transmission gate circuits 210T, 211T, 212T, 213T, 220T, 221T, 222T, and 223T.

In a current-mode operation, device 100 can control information CTL0, CTL1, CTL2, and CTL3 and CTL0*, CTL1*, CTL2*, and CTL3*, such that transmission gate circuits 210T, 211T, 212T, and 213T can be sequentially enabled (e.g., sequentially turned on) and transmission gate circuits 220T, 221T, 222T, and 223T can be sequentially enabled (e.g., sequentially turn on). In a current-mode operation, inverters 210I, 211I, 212I, and 213I can serve as resistive terminations and gain stages in drive units 210, 211, 212, and 213, respectively. Similarly, in a current-mode operation, inverters 220I, 221I, 222I, and 223I can serve as resistive terminations and gain stages in drive units 220, 221, 222, and 223, respectively.

As shown in FIG. 2, since transistors N of transmission gate circuits 210T and 220T are controlled by the same information CTL0, and transistors P of transmission gate circuits 210T and 220T are controlled by the same information CTL0*, transmission gate circuits 210T and 220T can be either concurrently enabled (e.g., concurrently turned on) or concurrently disabled (e.g., concurrently turned off). Similarly, transmission gate circuits 211T and 221T can be either concurrently enabled (e.g., concurrently turned on) or concurrently disabled (e.g., concurrently turned off). Transmission gate circuits 212T and 222T can be either concurrently enabled (e.g., concurrently turned on) or concurrently disabled (e.g., concurrently turned off). Transmission gate circuits 213T and 223T can be either concurrently enabled (e.g., concurrently turned on) or concurrently disabled (e.g., concurrently turned off).

A resistive path (e.g., which can conduct current) can be formed through a particular transmission gate circuit between the input node and the output of that particular transmission gate circuit when that particular transmission gate circuit is turned on (e.g., turned on during a current-mode operation). For example, a resistive path can be formed through transmission gate circuit 211T between the input node and the output of transmission gate circuit 211T when transmission gate circuit 211T is turned on during a current-mode operation. In this example, since transmission gate circuits 211T and 221T are controlled by the same control information (e.g., CTL1 and CTL1*), a resistive path can also be formed through transmission gate circuit 221T between the input node and the output of transmission gate circuit 221T when transmission gate circuit 221T is turned on during the current-mode operation.

Since a transmission gate circuit in a particular drive unit is coupled to the input and output nodes of the inverter of that particular drive unit, the resistive path formed by the transmission gate circuit can create a feedback path between the input and output nodes of the inverter of that particular drive unit. Improvements and benefits of the resistive path (e.g., feedback path) formed by a transmission gate circuit is mentioned above.

In FIG. 2, the resistive path through a particular transmission gate circuit during a current-mode operation can be formed during a time interval when transitions of signals representing the information (e.g., information Data1 or Data2) propagate through the drive unit that include that particular transmission gate. Such a time interval can be based on the timing of the signals that represent information CTL0, CTL1, CTL2, and CTL3 and CTL0*, CTL1*, CTL2*, and CTL3*. As described below with reference to FIG. 6, the timing of information CTL0, CTL1, CTL2, and CTL3 and CTL0*, CTL1*, CTL2*, and CTL3* can be based on a width of a pulse (e.g., pulse 609C in FIG. 6) that is used to generate information CTL0, CTL1, CTL2, and CTL3 and CTL0*, CTL1*, CTL2*, and CTL3*.

As described above, device 100 can operate in a voltage-mode operation where transmission gate circuits 210T, 211T, 212T, 213T, 220T, 221T, 222T, and 223T can be turned off. A resistive path may not be formed through a particular transmission gate circuit when that particular transmission gate circuit is turned off during a voltage-mode operation. Thus, device 100 can operate to form a resistive path through a particular transmission gate circuit during a current-mode operation. Device 100 can operate to disable (e.g., not to form) a resistive path through a particular transmission gate circuit during a voltage-mode operation.

Device 100 can be configured (e.g., programmed) to switch between voltage-mode operation and current-mode operation based on delay requirements during a particular operation of device 100. For example, in response to a condition that a relatively higher performance (e.g., turbo mode) is determined, device 100 can switch to a current-mode operation (e.g., by enabling transmission gate circuits 210T, 211T, 212T, 213T, 220T, 221T, 222T, and 223T). Device 100 can operate in (e.g., switch to) a current-mode operation in a cycle-to-cycle basis. In another example, in response to a condition that a relatively lower power application is determined, device 100 can switch to a voltage-mode operation (e.g., by disabling transmission gate circuits 210T, 211T, 212T, 213T, 220T, 221T, 222T, and 223T). Device 100 can operate in (e.g., switch to) a voltage-mode operation in a cycle-to-cycle basis.

FIG. 2 shows each of the transmission gate circuits of circuit paths 131 and 132 include two transistors (e.g., transistors N and P) as an example. However, each of the transmission gate circuits of include multiple transistors N and multiple transistors P.

Figure 3:
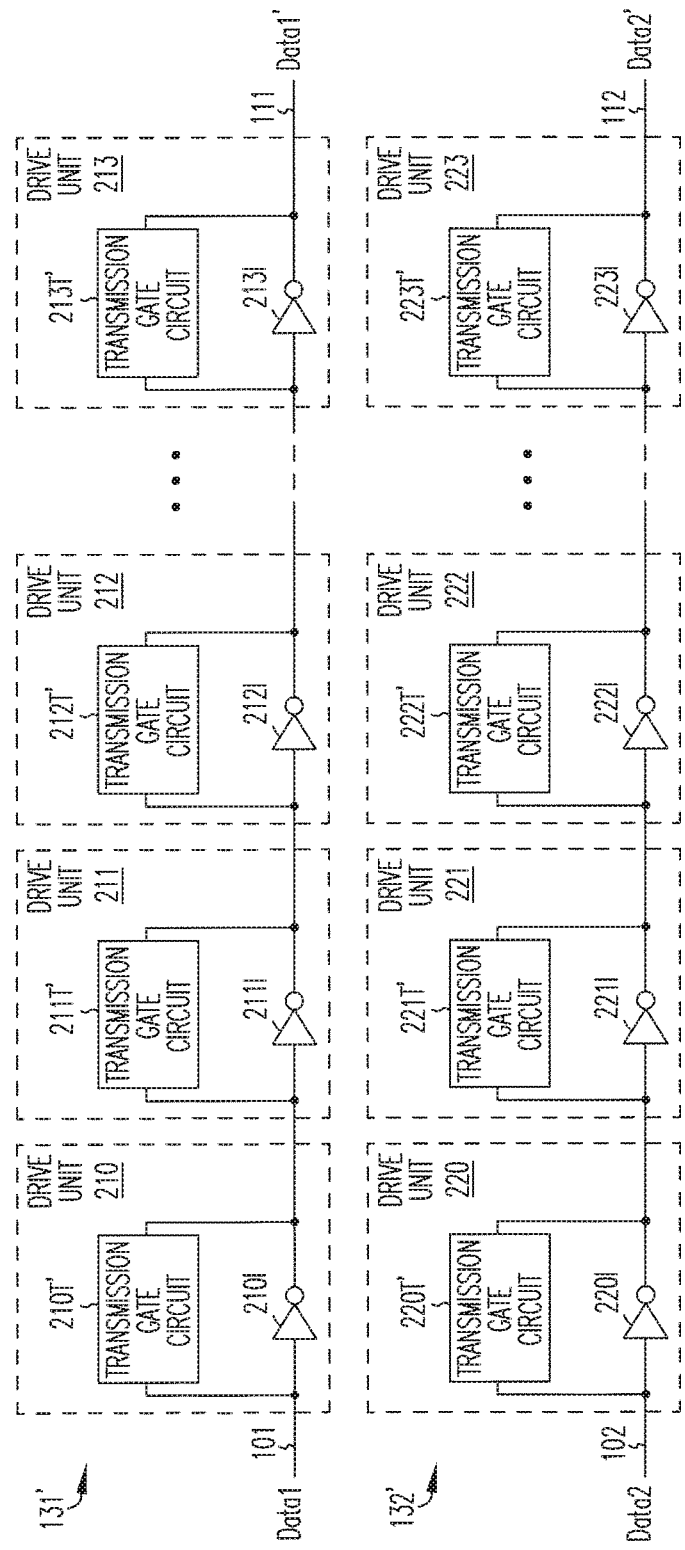
FIG. 3 and FIG. 4 show circuit paths of the interconnect structure of FIG. 1 where each transmission gate circuit in the circuit paths include multiple transistor pairs, according to some embodiments described herein.
Figure 4:
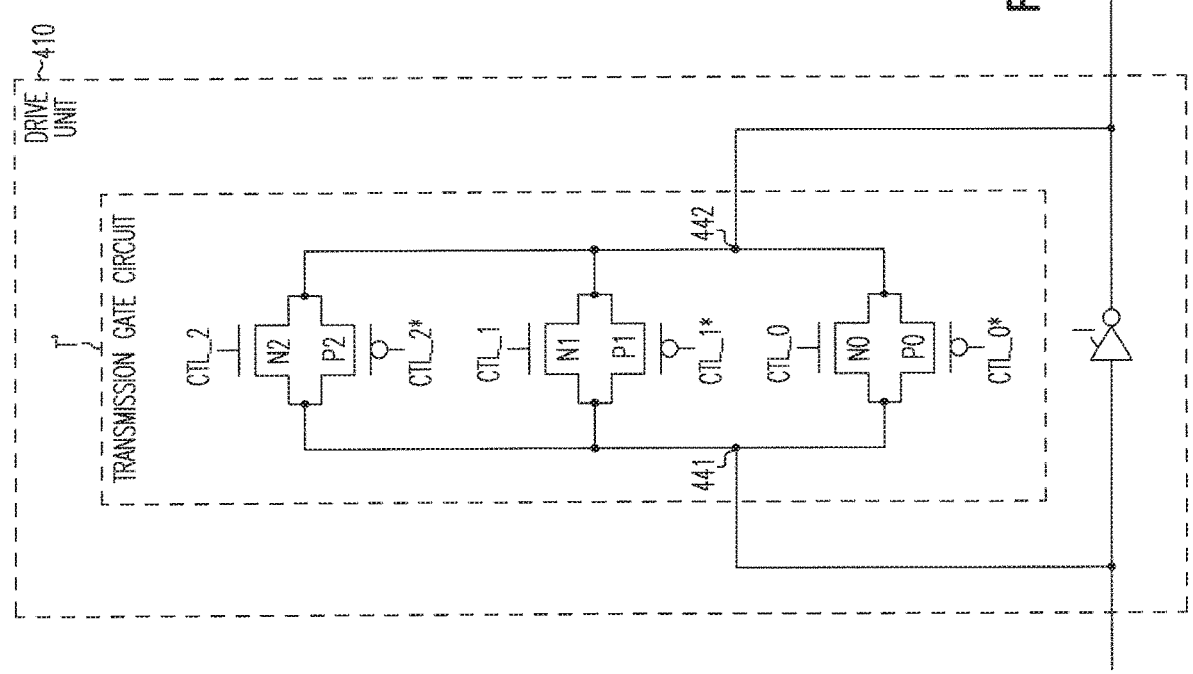

FIG. 3 and FIG. 4 show circuit paths 131' and 132' of interconnect structure 130 of device 100 where each transmission gate circuit can include multiple transistor pairs, according to some embodiments described herein. Circuit paths 131' and 132' can be variations of circuit paths 131 and 132, respectively, of interconnect structure 130 of FIG. 2. As shown in FIG. 3, circuit path 131' can include transmission gate circuit 210T', 211T', 212T', and 213T', each of which can be coupled to the input and output nodes of a respective inverter. Circuit path 132' can include transmission gate circuit 220T', 221T', 222T', and 223T', each of which can coupled to the input and output nodes of a respective inverter. Differences between FIG. 2 and FIG. 3 include differences in the structure of the transmission gate circuits of FIG. 2 and FIG. 3, as described below with reference to FIG. 4.

FIG. 4 shows a drive unit 410 including an inverter I and a transmission gate circuit T' having multiple transistor pairs N0/P0, N1/P1 and N2/P2, according to some embodiments described herein. As described above with reference to FIG. 2, each of the transmission gate circuits (e.g., transmission gate circuit 210T) can include a pair of transistors (one transistor N and one transistor P). In FIG. 4, each transmission gate circuit T' can include multiple transistor pairs (N0/P0, N1/P1 and N2/P2).

Drive unit 410 in FIG. 4 can be used for (e.g., can be included in) each of the drive units 210, 211, 212, 213, 220, 221, 222, and 2.23 of FIG. 3. Thus, each of transmission gate circuit 210T', 211T', 212T', 213T', 220T', 221T', 222', and 223T' of FIG. 3 can include the structure transmission gate circuit T' of FIG. 4. The structure of transmission gate circuit T' in FIG. 4 allows device 100 (FIG. 3) to include an adjustable strength of current-mode transmission gate (e.g., resistive termination) in drive units 210, 211, 212, 213, 220, 221, 222, and 223 to fine-tune (e.g., adjust) delay versus energy. For example, transistor pairs N0/P0, N1/P1 and N2/P2 can have different structures different transistor size, such as different channel lengths, different channel widths, or both among the transistor pairs. Such different structures can allow device 100 to control the resistance between nodes 441 and 442 (e.g., input and output nodes, respectively) of transmission gate circuit T' to adjust the strength of current-mode transmission gate circuit T' to fine-tune delay versus energy. The adjustment (e.g., adjustment of the resistive termination) be either analog (e.g., bias voltage) or digital (e.g., turn on or turn off progressively sized the transistors of transmission gate circuit T'). The adjustment can be performed on a cycle-to-cycle basis in response to the switching of data (e.g., performed on a cycle-to-cycle basis if the data is switching).

Transistor pairs N0/P0, N1/P1 and N2/P2 can be progressively sized (e.g., binary-weighed), such that transistor pairs N0/P0, N1/P1 and N2/P2 can have different sizes (e.g., sizes of 1×, 2×, and 4× relative to each other). For example, the size of transistor pairs N1/P1 and be two times the size of transistor pairs N0/P0, and the size of transistor pairs N2/P2 and be four times the size of transistor pairs N0/P0. In this example, a different combination of transistor pairs N0/P0, N1/P1 and N2/P2 can be activated (e.g., turned on) by a different combination of information CTL_0/CTL_0*, CTL_1/CTL_1*, and CTL_2/CTL_2*, to select the resistance (e.g., one out of eight different resistances) between nodes 441 and 442. Information CTL_0/CTL_0*, CTL_1/CTL_1*, and CTL_2/CTL_2* can be independently activated to select the resistance between nodes 441 and 442.

In addition to choosing repeater size and distance between drive units of FIG. 3, digital control of the transmission gate strength (as described above) enables runtime optimization of performance versus power. As the effective transmission gate size increases, the delay and voltage swings decrease while static current increases. At steady state, the voltage swing can decrease along the wire from a maximum swing at the output node of a repeater to a minimum at the input node of the next inverter. At design time, the lower interconnect delay achieved by current-mode operation can also be translated to longer inter-repeater distance at the same performance to reduce floorplan complexity.

Figure 5:
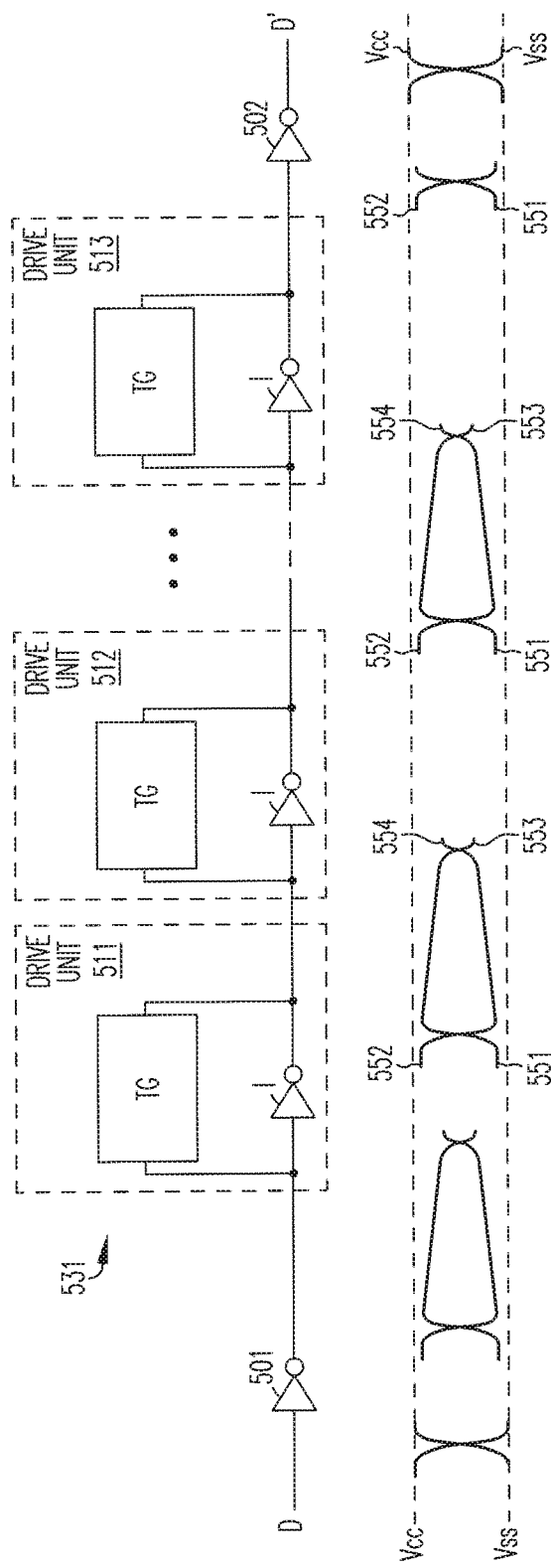
FIG. 5 shows a circuit path and example levels of signals that represent information (e.g., data) transmitted on the circuit path, according to some embodiments described herein.

FIG. 5 shows a circuit path 531 and example levels of signals that represent information (e.g., data) D transmitted on circuit path 531, according to some embodiments described herein. Circuit path 531 can correspond to (e.g., can be part of) any of circuit paths (e.g., circuit paths 131, 132, 131', and 132') of FIG. 2 and FIG. 3. As shown in FIG. 5, circuit path 531 can include drive units 501, 511, 512, 513, and 502. Drive unit 501 can include an inverter that can operate as a transmitter circuit to transmit information D. Drive unit 502 can include an inverter that can operate as a receiver circuit to receive information D and provide it to its output node as information D' (which is the same as information D). Drive units 511, 512, and 513 can be repeater circuits. As shown in FIG. 5, each of drive units 511, 512, and 513 can include an inverter and a transmission gate circuit TG. Transmission gate circuit TG can include any of transmission gate circuit in FIG. 2 or FIG. 3 (e.g., transmission gate circuit 210T in FIG. 2 or 201T' in FIG. 3).

As shown in FIG. 5, information D (at the input node of drive unit 501) can be represented by a signal having a level (e.g., representing a logic 0) that corresponds to a voltage Vss (e.g., ground) and by a signal having a level (e.g., representing a logic 1) that corresponds to a voltage Vcc (e.g., a supply voltage of device 100 of FIG. 1). Thus, as shown in FIG. 5, the signals representing information D in can switch between levels corresponding to voltages Vcc and Vss (e.g., rail-to-rail). FIG. 5 shows an example where circuit path is in a current-mode operation. The signal at the output node (not labeled) of a repeater (e.g., drive circuit 511, 512, or 513) can switch between a level 551 (which is greater than voltage Vss) and a level 552 (which is greater than level 551 and less than voltage Vcc). Eke information D, the signals at the output node (not labeled) of drive unit 502 that represent information can switch between levels corresponding to voltages Vcc and Vss (e.g., rail-to-rail).

Figure 6:
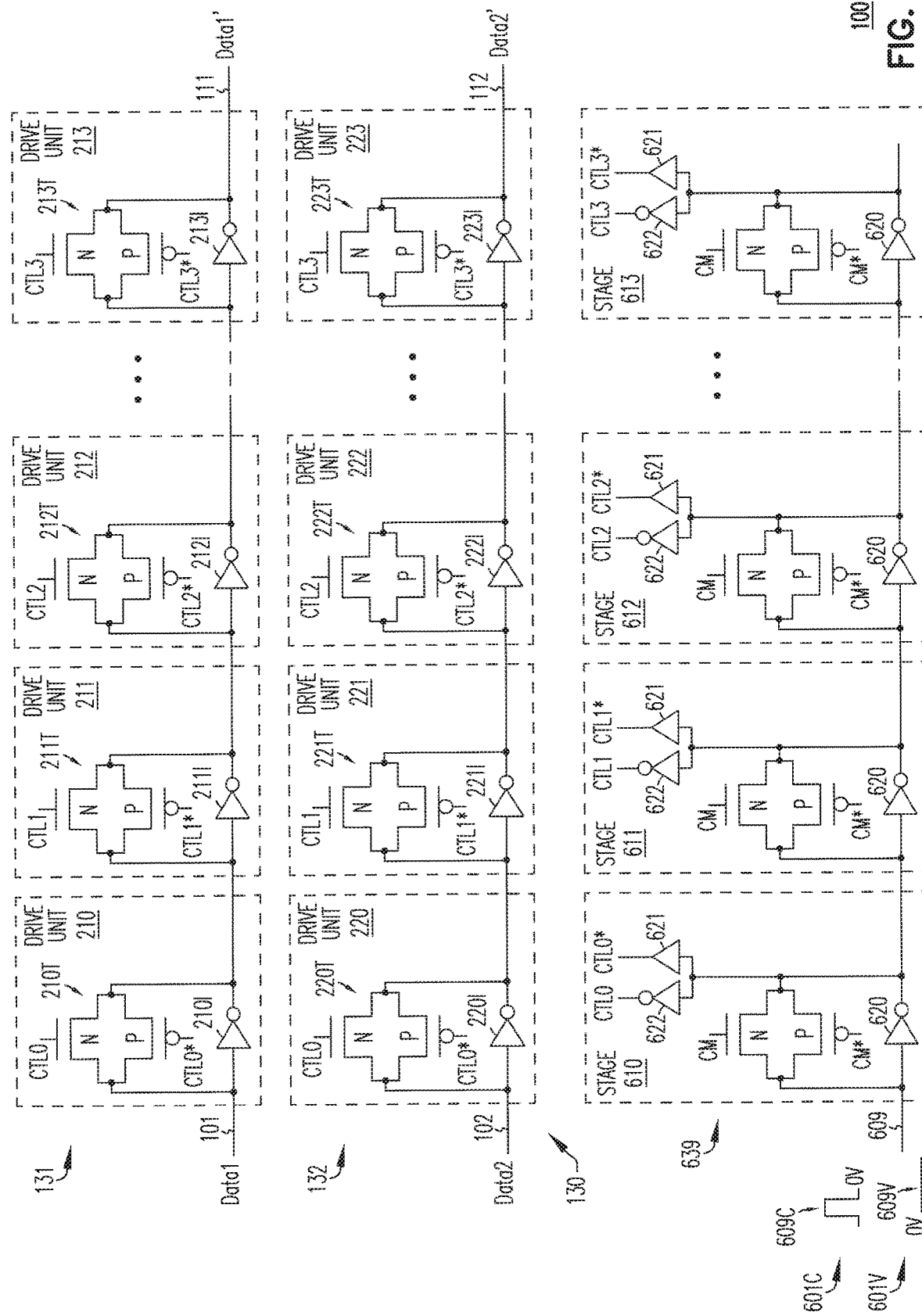
FIG. 6 shows the device of FIG. 1 including a control signal generator, according to some embodiments described herein.

FIG. 6 shows device 100 including a control signal generator 639, according to some embodiments described herein. For simplicity, the description of circuit paths 131 and 132 (which are described above with reference to FIG. 2) of device 100 in FIG. 6 is not repeated. In FIG. 6, control signal generator 639 can be part of control circuitry 139 of FIG. 1. As shown in FIG. 6, control signal generator 639 can include a circuit path (e.g., control circuit path) that can be formed in part by stages 610, 611, 612, and 613. The number of stages of control signal generator 639 can be the same as the number of drive units in each of circuit paths 131 and 132.

Each of stages 610, 611, 612, and 613 can include transistors N and P, inverters 620 and 622, and a buffer 621. Transistors N and P can be controlled (e.g., turned on or turned off) by information (e.g., control signals) CM and CM*, respectively. Information CM and CM* can have complementary values (e.g., complementary signals). Each of stages 610, 611, 612, and 613 can have output nodes at respective output nodes of buffer 621 and inverter 622. Control signal generator 639 can generate information CTL0, CTL1, CTL2, and CTL3 and CTL0*, CTL1*, CTL2*, and CTL3* at respective output nodes of stages 610, 611, 612, and 613 to control (e.g., enable or disable) transmission gate circuits 210T, 211T, 212T, 213T, 220T, 221T, 222T, and 223T in either voltage-mode operation or current-mode operation of device 100. Stages 610, 611, 612, and 613 can operate in either voltage-mode operation or current-mode operation.

FIG. 6 shows a signal (e.g., voltage-mode input signal) 609V having a level that can remain at 0V, and a pulse (e.g., current-mode input pulse) 609C. Signal 609V can be provided to node 609 during a voltage-mode operation of device 100. During a voltage-mode operation, information CM and CM* can be provided with voltage levels (e.g., corresponding to logic 0 and logic 1, respectively (e.g., CM="0" and CM*="1") to turn off transistors N and P of stages 610, 611, 612, and 613.

Signal 609V can be provided to node 609 during voltage-mode operation of device 100. During a current-mode operation, information CM and CM* can be provided with voltage levels (e.g., corresponding to logic 1 and logic 0, respectively (e.g., CM="1" and CM*="0") to turn on transistors N and P of stages 610, 611, 612, and 613. In a current-mode operation, pulse 609C sequentially propagate through stages 610, 611, 612, and 613. Buffer 621 and inverter 622 of each stages 610, 611, 612, and 613 can operate in a current-mode operation, such that information CTL0, CTL1, CTL2, and CTL3 and CTL0*, CTL1*, CTL2*, and CTL3* can sequentially enable transmission gate circuits 210T, 211T, 212T, 213T, 220T, 221T, 222T, and 223T to transmit information Data1 and Data2 from nodes 101 and 102, respectively, to nodes 111 and 112, respectively.

Including control signal generator 639 can improve operation (e.g., reduce energy overhead) of device 100 in a current-mode operation. For example, as shown in FIG. 6, stages 610, 611, 612, and 613 can include similar structures as that of drive units of circuit paths 131 and 132. Thus, information CTL0, CTL1, CTL2, and CTL3 and CTL0*, CTL1*, CTL2*, and CTL3* at respective stages 610, 611, 612, and 613 can propagate at the same speed as information Data1 and Data2 on circuit paths 131 and 132, respectively. The width of pulse 609C can be adjusted to ensure proper transmission of information (e.g., Data1 and Data2) on circuit paths 131 and 132. For example, the width of pulse 609C can be selected (e.g., designed) to be wide enough to operate circuit paths 131 and 132 in a current-mode operation when information Data1 and Data2 pass through respective drive units. Further, the width of pulse 609C can be selected not to be too wide, so that the drive units of interconnect structure 130 can stay in voltage-mode operation to eliminate static power overhead when information (e.g., Data1 and Data2) is not passing. The width of pulse 609C can be selected to accommodate delay variation between information transmitted on circuit paths 131 and 132 and respective information CTL0, CTL1, CTL2, and CTL3 and CTL0*, CTL1*, CTL2*; and CTL3* and the slew rate of the transmitted pulse.

Device 100 can operate in a transient current-mode where current-mode operation can be enabled or disabled (e.g., to adjust current-mode transmission gate circuit (resistive termination) strength) of drive units 210, 211, 212, 213, 220, 222, and 223 during a short window that covers the time when data transitions (information Data1 or Data2) propagate through a certain drive unit (e.g., repeater circuit) in a respective circuit path (e.g., circuit path 131 or 132). The window can be controlled by pulse 609C that propagates through stages 610, 611, 612, and 613 of a control circuit path separated from circuit paths 131 and 132.

As described above with reference to FIG. 2, a resistive path (e.g., which can conduct current) can be formed through a particular transmission gate circuit when that particular transmission gate circuit is turned on during a current-mode operation. In FIG. 6, the resistive path through a particular transmission gate during a current-mode operation can be formed during a time interval based on corresponding to) the width of pulse 609C.

Figure 7:
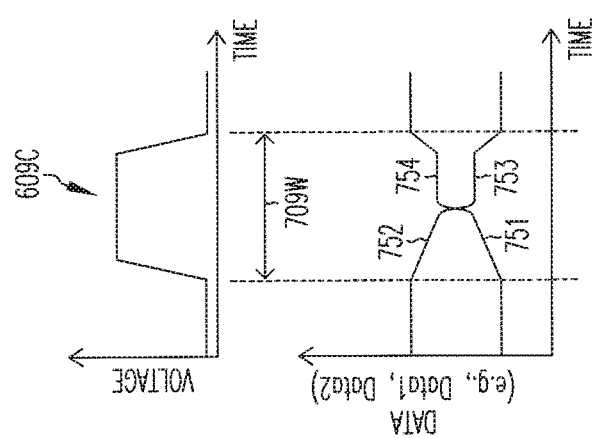
FIG. 7 shows an example relationship between a width of a pulse in FIG. 6 and signals that represent the value of information transmitted on some of the circuit paths of the interconnect structure of FIG. 6, according to some embodiments described herein.

FIG. 7 shows an example relationship between a width 709W of pulse 609C of FIG. 6 and signals that represent the value of information (e.g., Data1 and Data2) transmitted on circuit paths 131 and 132 of FIG. 6, according to some embodiments described herein. As shown in FIG. 7, width 709W can be selected (e.g., designed) such that levels 751, 752, 753, and 754 of the signals at the input node of each of the drive units of circuit paths 131 and 132 can be within width 709W. This allows the bits of information (e.g., Data1 and Data2) transmitted on circuit paths 131 and 132 to be properly transmitted (e.g., properly locked to the timing of pulse 609C) at each of the drive units of circuit paths 131 and 132.

Figure 8:
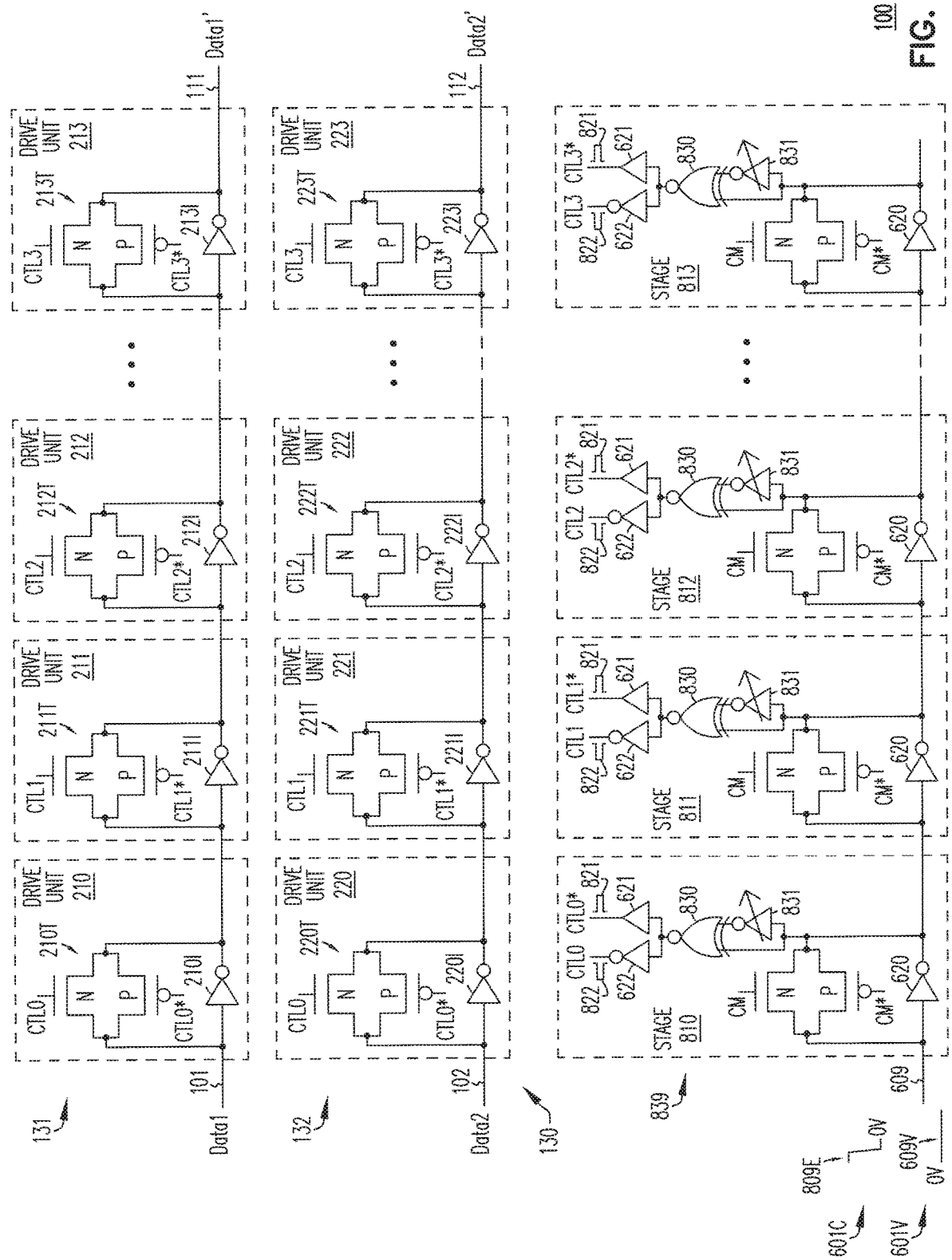
FIG. 8 shows the device of FIG. 1 including a control signal generator to generate local pulses, according to some embodiments described herein.

FIG. 8 shows device 100 including a control signal generator 839 to generate local pulses, according to some embodiments described herein. Control signal generator 839 can be a variation of control signal generator 639 of FIG. 6. As shown in FIG. 8, control signal generator 839 can include stages 810, 811, 812, and 813 that can include similar circuit elements as stages 610, 611, 612, and 613, respectively, of FIG. 6. For simplicity, similar or identical circuit elements between control signal generators 639 and 839 are given the same labeled and their description is not repeated.

Different between control signal generators 639 and 839 include the addition of logic gate (e.g., exclusive NOR gate) 830 and an adjustable delay circuit 831 in each of stages 810, 811, 812, and 813. FIG. 8 also shows an edge 809E (e.g., a single edge of a signal). During a current-mode operation, edge 809E (instead of a pulse (e.g., pulse 609C in FIG. 6) can be provided to node 609 in FIG. 8. Stages 810, 811, 812, and 813 can operate to generate information CTL0, CTL1, and CTL3 and CTL0*, CTL1*, CTL2*, and CTL3*.

As shown in FIG. 8, the values of information CTL0, CTL1, CTL2, and CTL3 and CTL0*, CTL1*, CTL2*, and CTL3* can be based on the widths of pulses 821 and 822 at the output nodes of buffer 621 and inverter 622, respectively, of a respective stage among stages 810, 811, 812, and 813. Pulses 821 and 822 are locally generated (generated by stages 810, 811, 812, and 813 based on edge 809E). The widths of pulses 821 and 822 can be adjusted (e.g., by adjusting the amount of delay of adjustable delay circuit 831 of each of stages 810, 811, 812, and 813).

As described above with reference to FIG. 6, resistive termination of drive units 210, 211, 212, 213, 220, 221, 222, and 223 can be adjusted (in current-mode operation) based on pulse 609C that propagates through stages 610, 611, 612, and 613 of FIG. 6. In FIG. 8, resistive termination of drive units 210, 211, 212, 213, 220, 221, 222, and 223 can be adjusted (in current-mode operation) by locally generated pulses 821 and 822 during a short window that covers the time when data transitions (information Data1 or Data2) propagate through a certain drive unit (e.g., repeater circuit) in a respective circuit path (e.g., circuit path 131 or 132). The window can be controlled by pulses 821 and 822 where the widths of pulses 821 and 822 can be adjustable. Benefit of control signal generators 839 can include a stepper slew of the signals that represent inform information CTL©, CTL1, CTL2, and CTL3 and CTL0*, CTL1*, CTL2*, and CTL3* (narrower pulse requirement) and lower energy overhead.

Figure 9:
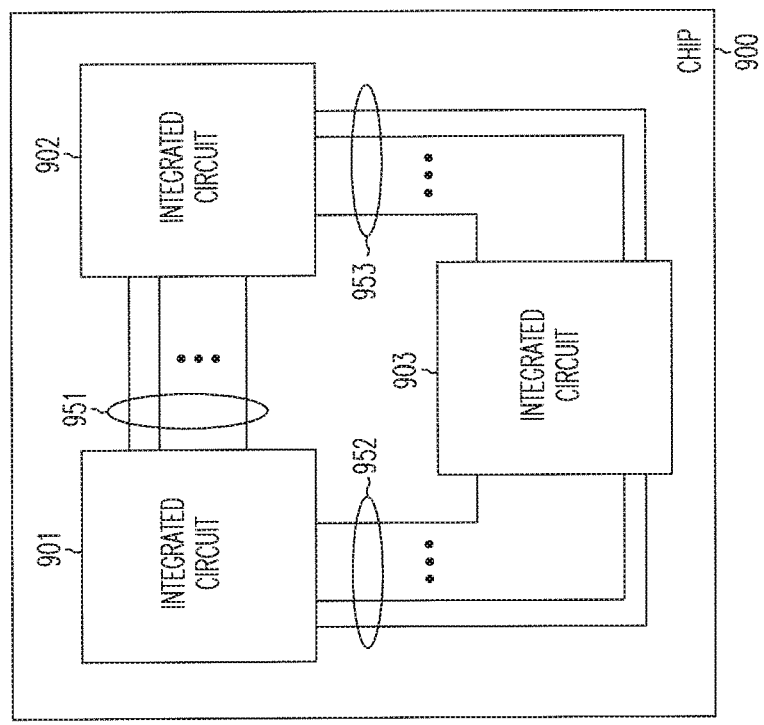
FIG. 9 shows a single chip having multiple devices and multiple interconnect structures, according to some embodiments described herein.

FIG. 9 shows a single chip 900 having multiple devices and multiple interconnect structures 951, 952, and 953, according to some embodiments described herein. Chip 900 can include integrated circuits 901, 902, and 903. Each of integrated circuits 901, 902, and 903 may be a processing unit, a memory controller, a memory device, or other types of integrated circuits. In some embodiments, chip 900 can include multiple processors presented by at least two of the integrated circuits 901, 902, and 903. Each of integrated circuits 901, 902, and 903 can include device 100 described above with reference to in FIG. 1 through FIG. 8. Each of interconnect structures 951, 952, and 953 include (e.g., can serve as) an on-die bus to transmit data among integrated circuits 901, 902, and 903.

In FIG. 9, interconnect structures 951, 952, and 953 are shown as lines, without drive units. However, the lines of interconnect structures 951, 952, and 953 can represent circuit paths such as any of the circuit paths (e.g., circuit paths 131-135) described in FIG. 1 through FIG. 18. Further, interconnect structures 951, 952, and 953 can include any combination of the interconnect structures and circuit paths described in FIG. 1 through FIG. 8. For example, each of interconnect structures 951, 952, and 953 can include circuit paths similar to circuit paths 131 and 132 (FIG. 2) or circuit paths 131' and 132' (FIG. 3).

FIG. 10 shows an apparatus in the form of a system (e.g., electronic system) 1000, according to some embodiments described herein. System 1000 can include or be included in a computer (e.g., desktop or notebook computer), a tablet, a cellular telephone, and other electronic devices or systems. As shown in FIG. 10, system 1000 can include a processor 1010, a memory device 1020, a memory controller 1030, a graphics controller 1040, an input and output (I/O) controller 1050, a display 1052, a keyboard 1054, a pointing device 1056, at least one antenna 1058, a connector 615, and a bus 1060.

Processor 1010 can include a general-purpose processor or an application specific integrated circuit (ASIC). Memory device 1020 can include a DRAM device, an SRAM device, a flash memory device, a phase change memory, or a combination of these memory devices. Memory device 1020 may include other types of memory. Display 1052 can include a liquid crystal display (LCD), a touchscreen (e.g., capacitive or resistive touchscreen), or another type of display. Pointing device 1056 can include a mouse, a stylus, or another type of pointing device.

I/O controller 1050 can include a communication module for wired or wireless communication (e.g., communication through one or more antenna 1058). Such wireless communication may include communication in accordance with WiFi communication technique, Long Term Evolution Advanced (LTE-A) communication technique, or other communication techniques.

I/O controller 1050 can also include a module to allow system 1000 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 1015 can be arranged (e.g., can include terminals, such as pins) to allow system 1000 to be coupled to an external device (or system). This may allow system 1000 to communicate (e.g., exchange information) with such a device (or system) through connector 1015.

Connector 1015 and at least a portion of bus 1060 can include conductive lines that conform with at least one of USB, DP, HDMI, Thunderbolt, PCIe, Ethernet, and other specifications.

FIG. 10 shows the components of system 1000 arranged separately from each other as an example. In some arrangements, two or more components of system 1000 can be located on the same die (e.g., same chip) that forms a system-on-chip (SoC).

In some embodiments, system 1000 may not include one or more of the components shown in FIG. 10. For example, system 1000 may not include at least one of display 1052, keyboard 1054, pointing device 1056, antenna 1058, connector 615, and other components shown in FIG. 10.

At least one of processor 1010, memory device 1020, memory controller 1030, graphics controller 1040, and input and output (I/O) controller 1050 can include chip 900 described above with reference to FIG. 9. At least one of processor 1010, memory device 1020, memory controller 1030, graphics controller 1040, and input and output (110) controller 1050 can include device 100 described above with reference to FIG. 1 through FIG. 9. Thus, at least one of the devices shown in system 1000 can include embodiments of the interconnect structures described in FIG. 1 through FIG. 9 in which the interconnect structures can serve as one or more on-chip buses to transfer data within the device. For example, processor 1010 can include embodiments of interconnect structures described in FIG. 1 through FIG. 9 to transfer data within processor 1010.

In some embodiments, two or more devices shown in system 1000 may be formed in a single chip in which the single chip can include embodiments of the interconnect structures described in FIG. 1 through FIG. 9 to serve as an on-chip bus to transfer data among the devices on the single chip.

The embodiments described may be implemented in one or a combination of hardware, firmware and software. Embodiments may also be implemented as instructions stored on a computer-readable storage medium, which may be read and executed by at least one processor to perform the operations and activities described herein. A computer-readable storage medium may include any non-transitory mechanism for storing information (e.g., instructions) in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors (e.g., processor 1210) may be configured with the instructions to perform the operations and activities described herein.

The illustrations of apparatus (e.g., device 100, chip 900, and system 1000) and methods (e.g., the operations of device 100, chip 900, and system 1000) described above with reference to FIG. 1 through FIG. 10 are intended to provide a general understanding of the structure of various embodiments and are not intended to provide a complete description of all the elements and features of apparatuses that might make use of the structures described herein.

The apparatus (e.g., device 100, chip 900, and system 1000) and methods (e.g., the operations of device 100, chip 900, and system 1000) described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only, (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

ADDITIONAL NOTES AND EXAMPLES

Example 1 includes subject matter (such as a device, an electronic apparatus (e.g., circuit, electronic system, or both), or a machine) including a first circuit path including drive units coupled in series between a first node and a first additional node, a second circuit path including drive units coupled in series between a second node and a second additional node, each drive unit of the driver units of the first circuit path and the second circuit path including an inverter, and a transmission gate circuit including an input node and an output node coupled to an input node and an output node, respectively, of the inverter, and control circuitry to provide control information to the transmission gate circuit of each of the driver units of the first circuit path and the second circuit path.

In Example 2, the subject matter of Example 1 may optionally include, wherein the first circuit path is to propagate first information from the first node to the first additional node during an operation of the apparatus, the second circuit path is to propagate second information from the second node to the second additional node during the operation, and the control circuitry is to turn on the transmission gate circuit of each of the driver units of the first circuit path and the second circuit path during the operation.

In Example 3, the subject matter of Example 1 may optionally include, wherein the first circuit path is to propagate first information from the first node to the first additional node during an operation of the apparatus, the second circuit path is to propagate second information from the second node to the second additional node during the operation, and the control circuitry is to turn off the transmission gate circuit of each of the driver units of the first circuit path and the second circuit path during the operation.

In Example 4, the subject matter of Example 1 may optionally, include, wherein the control circuitry is to provide analog signals to gate terminals of transistors of the transmission gate circuit of each of the driver units of the first circuit path and the second circuit path.

In Example 5, the subject matter of Example 1 may optionally include, wherein the control circuitry is to provide digital signals to gate terminals of transistors of the transmission gate circuit of each of the driver units of the first circuit path and the second circuit path.

In Example 6, the subject matter of Example 1 may optionally include, wherein the transmission gate circuit of a drive unit of the drive units of each of the first circuit path and the second circuit path includes a first transistor including a source terminal and a drain terminal coupled to an input node and an output node, respectively, of the inverter of the drive unit, and a second transistor including a source terminal and a drain terminal coupled to the input node and the output node, respectively, of the inverter of the drive unit.

In Example 7, the subject matter of Example 6 may optionally include, wherein the transmission gate circuit of the drive unit includes a first additional transistor including a source terminal and a drain terminal coupled to the input node and the output node, respectively, of the inverter of the drive unit, and a second additional transistor including a source terminal and a drain terminal coupled to the input node and the output node, respectively, of the inverter of the drive unit.

In Example 8, the subject matter of Example 7 may optionally include, wherein the first transistor and the first additional transistor have different sizes, and the second transistor and the second additional transistor have different sizes.

In Example 9, the subject matter of Example 1 may optionally include, wherein the control circuitry includes stages to propagate a pulse through the stages and generate the control information at outputs of the stages.

In Example 10, the subject matter of Example 9 may optionally include, wherein a width of the pulse is adjustable.

In Example 11, the subject matter of Example 9 may optionally include, wherein each of the stages is configured to operate in either a voltage-mode operation or a current-mode operation.

In Example 12, the subject matter of Example 1 may optionally include, wherein the control circuitry includes stages to propagate an edge of a signal through the stages and generate the control information in the form of pulses at respective output nodes of the stages.

In Example 13, t the subject matter of Example 12 may optionally include, wherein each of the stages includes an adjustable delay circuit to adjust a width of a respective pulse of the pulses.

In Example 14, the subject matter of Example 12 may optionally include, wherein each of the stages is configured to operate in either a voltage-mode operation or a current-mode operation.

Example 15 includes subject matter (such as a device, an electronic apparatus e.g., circuit, electronic system, or both), or a machine) including a first circuit path including first drive units coupled between a first node and a first additional node, each of the first drive units including an inverter, the first circuit path configured to transmit first information from the first node to the first additional node an operation of the apparatus, a second circuit path including second drive units coupled between a second node and a second additional node, each of the second drive units including an inverter, the second circuit path configured to transmit second information from the second node to the second additional node during the operation, and control circuitry to cause a resistive path to form between an input node and an output node of the inverter of each of the first and second drive units during the operation.

In Example 16, the subject matter of Example 15 may optionally include, wherein the first circuit path is configured to transmit a first additional information from the first node to the first additional node an additional operation of the apparatus, the second circuit path is configured to transmit a second additional information from the second node to the second additional node during the additional operation, and the control circuitry is configured to disable the resistive path between the input node and the output node of the inverter of each of the drive units of the first circuit path and the second circuit path during the additional operation.

In Example 17, the subject matter of Example 15 may optionally include, wherein a first drive unit among the first drive units includes a first transmission gate circuit coupled to the input node and the output node of the inverter of the first drive unit, and the resistive path between the input node and the output node of the inverter of the first drive unit includes a path through the first transmission gate circuit, and a second drive unit among the second drive units includes a second transmission gate circuit coupled to the input node and the output node of the inverter of the second drive unit, and the resistive path between the input node and the output node of the inverter of the second drive unit includes a path through the second transmission gate circuit.

In Example 18, the subject matter of Example 17 may optionally include, wherein the control circuitry is configured to provide a same control information to the first and second transmission gate circuits.

In Example 19, the subject matter of Example 15 may optionally include, wherein the resistive path between the input node and the output node of the inverter of a drive unit of the first drive units is formed during a time interval when transitions of signals representing the first information propagate through the drive unit of the first drive units, and the resistive path between the input node and the output node of the inverter of a drive unit of the second drive units is formed during a time interval when transitions of signals representing the second information propagate through the drive unit of the second drive units.

In Example 20, the subject matter of Example 19 may optionally include, wherein the time interval is based on a width of a pulse that propagates through a control path coupled to the first circuit path and the second circuit path.

Example 21 includes subject matter (such as a device, an electronic apparatus (e.g., circuit, electronic system, or both), or a machine) including a processor including a first functional unit, a second functional unit, and an interconnect structure coupled between the first and second functional units, the interconnect structure including a first circuit path including drive units coupled in series between a first node and a first additional node, a second circuit path including drive units coupled in series between a second node and a second additional node, each drive unit of the driver units of the first circuit path and the second circuit path including an inverter, and a transmission gate circuit including an input node and an output node coupled to an input node and an output node, respectively, of the inverter, and control circuitry to provide control information to the transmission gate circuit of each of the driver units of the first circuit path and the second circuit path, and antenna coupled to the processor.

In Example 22, the subject matter of Example 21 may optionally include further comprising a connector coupled to the processor, the connector conforming with one of Universal Serial Bus (USB), High-Definition Multimedia interface (HDMI), Thunderbolt, Peripheral Component Interconnect Express (PCIe), and Ethernet specifications.

The subject matter of Example 1 through Example 22 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiting an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a first circuit path including drive units coupled in series between a first node and a first additional node;
   a second circuit path including drive units coupled in series between a second node and a second additional node;
   each drive unit of the driver units of the first circuit path and the second circuit path including an inverter, and a transmission gate circuit including an input node directly coupled to an input node of the inverter and an output node directly coupled to an output node of the inverter; and
   control circuitry to provide control information to the transmission gate circuit of each of the driver units of the first circuit path and the second circuit path.

2. The apparatus of claim 1, wherein:
   the first circuit path is to propagate first information from the first node to the first additional node during an operation of the apparatus;
   the second circuit path is to propagate second information from the second node to the second additional node during the operation; and
   the control circuitry is to turn on the transmission gate circuit of each of the driver units of the first circuit path and the second circuit path during the operation.

3. The apparatus of claim 1, wherein:
   the first circuit path is to propagate first information from the first node to the first additional node during an operation of the apparatus;

the second circuit path is to propagate second information from the second node to the second additional node during the operation; and the control circuitry is to turn off the transmission gate circuit of each of the driver units of the first circuit path and the second circuit path during the operation.

4. An apparatus comprising:
a first circuit path including drive units coupled in series between a first node and a first additional node;
a second circuit path including drive units coupled in series between a second node and a second additional node;
each drive unit of the driver units of the first circuit path and the second circuit path including an inverter, and a transmission gate circuit including an input node and an output node coupled to an input node and an output node, respectively, of the inverter; and
control circuitry to provide control information to the transmission gate circuit of each of the driver units of the first circuit path and the second circuit path, wherein the control circuitry is to provide analog signals to gate terminals of transistors of the transmission gate circuit of each of the driver units of the first circuit path and the second circuit path.

5. The apparatus of claim 1, wherein the control circuitry is to provide digital signals to gate terminals of transistors of the transmission gate circuit of each of the driver units of the first circuit path and the second circuit path.

6. The apparatus of claim 1, wherein the transmission gate circuit of a drive unit of the drive units of each of the first circuit path and the second circuit path includes:
a first transistor including a source terminal and a drain terminal coupled to an input node and an output node, respectively, of the inverter of the drive unit; and
a second transistor including a source terminal and a drain terminal coupled to the input node and the output node, respectively, of the inverter of the drive unit.

7. The apparatus of claim 6; wherein the transmission gate circuit of the drive unit includes:
a first additional transistor including a source terminal and a drain terminal coupled to the input node and the output node, respectively, of the inverter of the drive unit; and
a second additional transistor including a source terminal and a drain terminal coupled to the input node and the output node, respectively, of the inverter of the drive unit.

8. The apparatus of claim 7, wherein the first transistor and the first additional transistor have different sizes, and the second transistor and the second additional transistor have different sizes.

9. An apparatus comprising:
a first circuit path including drive units coupled in series between a first node and a first additional node;
a second circuit path including drive units coupled in series between a second node and a second additional node;
each drive unit of the driver units of the first circuit path and the second circuit path including an inverter, and a transmission gate circuit including an input node and an output node coupled to an input node and an output node, respectively, of the inverter; and
control circuitry to provide control information to the transmission gate circuit of each of the driver units of the first circuit path and the second circuit path, wherein the control circuitry includes stages to propagate a pulse through the stages and generate the control information at outputs of the stages.

10. The apparatus of claim 9, wherein a width of the pulse is adjustable.

11. The apparatus of claim 9, wherein each of the stages is configured to operate in either a voltage-mode operation or a current-mode operation.

12. The apparatus of claim 1, wherein the control circuitry includes stages to propagate an edge of a signal through the stages and generate the control information in the form of pulses at respective output nodes of the stages.

13. The apparatus of claim 12, wherein each of the stages includes an adjustable delay circuit to adjust a width of a respective pulse of the pukes.

14. The apparatus of claim 12, wherein each of the stages is configured to operate in either a voltage-mode operation or a current-mode operation.

15. An apparatus comprising:
a first circuit path including first drive units coupled between a first node and a first additional node, each of the first drive units including an inverter, the first circuit path configured to transmit first information from the first node to the first additional node during an operation of the apparatus;
a second circuit path including second drive units coupled between a second node and a second additional node, each of the second drive units including an inverter, the second circuit path configured to transmit second information from the second node to the second additional node during the operation; and
control circuitry to cause a resistive path to form between an input node and an output node of the inverter of each of the first and second drive units during the operation, wherein:
a first drive unit among the first drive units includes a first transmission gate circuit, the first transmission gate circuit including an input node directly coupled to the input node of the inverter of the first drive unit and an output node directly coupled to the output node of the inverter of the first drive unit, and the resistive path between the input node and the output node of the inverter of the first drive unit includes a path through the first transmission gate circuit; and
a second drive unit among the second drive units includes a second transmission gate circuit, the second transmission gate circuit including an input node directly coupled to the input node of the inverter of the second drive unit and an output node directly coupled to the output node of the inverter of the second drive unit, and the resistive path between the input node and the output node of the inverter of the second drive unit includes a path through the second transmission gate circuit.

16. The apparatus of claim 15, wherein:
the first circuit path is configured to transmit a first additional information from the first node to the first additional node an additional operation of the apparatus;
the second circuit path is configured to transmit a second additional information from the second node to the second additional node during the additional operation; and
the control circuitry is configured to disable the resistive path between the input node and the output node of the inverter of each of the drive units of the first circuit path and the second circuit path during the additional operation.

17. An apparatus comprising:
a first circuit path including first drive units coupled between a first node and a first additional node, each of the first drive units including an inverter, the first circuit path configured to transmit first information from the first node to the first additional node an operation of the apparatus;
a second circuit path including second drive units coupled between a second node and a second additional node, each of the second drive units including an inverter, the second circuit path configured to transmit second information from the second node to the second additional node during the operation; and
control circuitry to cause a resistive path to form between an input node and an output node of the inverter of each of the first and second drive units during the operation, wherein:
a first drive unit among the first drive units includes a first transmission gate circuit coupled to the input node and the output node of the inverter of the first drive unit, and the resistive path between the input node and the output node of the inverter of the first drive unit includes a path through the first transmission gate circuit; and
a second drive unit among the second drive units includes a second transmission gate circuit coupled to the input node and the output node of the inverter of the second drive unit, and the resistive path between the input node and the output node of the inverter of the second drive unit includes a path through the second transmission gate circuit, wherein the control circuitry is configured to provide a same control information to the first and second transmission gate circuits.

18. The apparatus of claim 15, wherein:
the resistive path between the input node and the output node of the inverter of a drive unit of the first drive units is formed during a time interval when transitions of signals representing the first information propagate through the drive unit of the first drive units; and
the resistive path between the input node and the output node of the inverter of a drive unit of the second drive units is formed during a time interval when transitions of signals representing the second information propagate through the drive unit of the second drive units.

19. The apparatus of claim 18, wherein the time interval is based on a width of a pulse that propagates through a control path coupled to the first circuit path and the second circuit path.

20. An apparatus comprising:
a processor including a first functional unit, a second functional unit, and an interconnect structure coupled between the first and second functional units, the interconnect structure including:
a first circuit path including drive units coupled in series between a first node and a first additional node;
a second circuit path including drive units coupled in series between a second node and a second additional node;
each drive unit of the driver units of the first circuit path and the second circuit path including an inverter, and a transmission gate circuit including an input node directly coupled to an input node of the inverter and an output node directly coupled to an output node of the inverter; and
control circuitry to provide control information to the transmission gate circuit of each of the driver units of the first circuit path and the second circuit path; and
antenna coupled to the processor.

21. The apparatus of claim 20, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

* * * * *